(12) United States Patent
Junhua

(10) Patent No.: US 6,918,659 B2
(45) Date of Patent: Jul. 19, 2005

(54) PIEZOELECTRIC ELEMENT, PIEZOELECTRIC ACTUATOR AND LIQUID EJECTION HEAD INCORPORATING THE SAME

(75) Inventor: Chang Junhua, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 42 days.

(21) Appl. No.: 10/390,167

(22) Filed: Mar. 18, 2003

(65) Prior Publication Data

US 2004/0046838 A1 Mar. 11, 2004

(30) Foreign Application Priority Data

Mar. 18, 2002 (JP) .................................. P2002-075086
Jul. 8, 2002 (JP) .................................. P2002-199176
Mar. 14, 2003 (JP) .................................. P2003-069234

(51) Int. Cl.[7] ........................... B41J 2/045; H01L 41/04
(52) U.S. Cl. ........................................ 347/71; 310/346
(58) Field of Search ........................... 310/311, 324, 310/328, 330, 331, 346; 347/68–73

(56) References Cited

U.S. PATENT DOCUMENTS 5,984,458 A * 11/1999 Murai ....................... 347/68
6,504,287 B2   1/2003 Yun et al.

FOREIGN PATENT DOCUMENTS

| JP | 03-285374 | * 4/1990 |
| JP | 2-289352 | 11/1990 |
| JP | 3-128681 | 5/1991 |
| JP | 9-277531 | 10/1997 |
| JP | 9-323410 | 12/1997 |
| JP | 10-034924 | 2/1998 |
| JP | 11-005305 | 1/1999 |
| JP | 2000-077438 | 3/2000 |
| JP | 2000-141647 | 5/2000 |
| JP | 2000-332313 | 11/2000 |
| JP | 2001-077438 | 3/2001 |
| WO | WO 02/073710 A1 | 9/2002 |

* cited by examiner

Primary Examiner—Manish S. Shah
Assistant Examiner—Geoffrey Mruk
(74) Attorney, Agent, or Firm—Sughrue Mion, PLLC

(57) ABSTRACT

A first common electrode is fixed at a predetermined potential. A first piezoelectric layer is laminated on the first common electrode and has a first deformability with respect to a predetermined voltage. A drive electrode is laminated on the first piezoelectric layer, to which a drive signal is supplied externally. A second piezoelectric layer is laminated on the drive electrode and having a second deformability with respect to the predetermined voltage which is larger than the first deformability. A second common electrode is laminated on the second piezoelectric layer and to be fixed at the predetermined potential.

5 Claims, 13 Drawing Sheets

PIEZOELECTRIC ELEMENT, PIEZOELECTRIC ACTUATOR AND LIQUID EJECTION HEAD INCORPORATING THE SAME

BACKGROUND OF THE INVENTION

The invention relates to a piezoelectric element which becomes deformed upon receipt of a supplied drive signal, to a piezoelectric actuator and a liquid ejecting head incorporating the piezoelectric element as a drive source.

A piezoelectric element is formed from piezoelectric ceramics or a piezoelectric macromolecular film utilizing a high molecular compound and becomes deformed upon receipt of supplied electric energy. Here, the piezoelectric ceramics is formed by compacting and sintering metal oxide powder, such as $BaTiO_3$, $PbZrO_3$, $PbTiO_3$, which are piezoelectric materials and exhibit a piezoelectric effect. The piezoelectric element has been in widespread use as a drive element for, e.g., a liquid ejecting head, a micropump, and a sounding body (a speaker or the like). Here, the liquid ejecting head ejects a droplet from a nozzle orifice by inducing pressure fluctuations in a liquid stored in a pressure chamber. The liquid ejecting head is embodied as, e.g., a recording head to be used in an image recording apparatus such as a printer, a liquid-crystal ejecting head for use in manufacturing a liquid-crystal display, and a coloring material ejecting head to be used for manufacturing a color filter. Here, the micropump is an ultrasmall pump capable of ejecting a very small volume of liquid and used at the time of, e.g., delivery of a trace amount of chemical.

One of the important components used in such a liquid ejecting head and a micropump is a piezoelectric actuator formed by placing a piezoelectric element on the surface of a vibration plate. The piezoelectric actuator is mounted on a pressure chamber formation substrate having a void which is to serve as a pressure chamber, and a portion of the pressure chamber is partitioned by the vibration plate. When ejection of a droplet or delivery of liquid is to be performed, a drive pulse is supplied to the piezoelectric element, to thereby deform the piezoelectric element and the vibration plate (i.e., the deformed portion of the pressure chamber) and change the volume of the pressure chamber.

In the field of the liquid ejecting head and that of the micropump, strong demand exists for high-frequency driving of the piezoelectric element. This demand is intended for implementing high-frequency ejection of a droplet and enhancing liquid delivery capability. In order to implement high-frequency driving of the piezoelectric element, the compliance of the deformed portion must be made smaller than that of a related-art piezoelectric element and the extent to which the piezoelectric element is deformed must be made greater than that to which the related-art piezoelectric element is deformed. The reason for this is that a reduction in the compliance of the deformed portion results in enhancement of responsiveness, and hence driving of the piezoelectric element at a frequency higher than that required conventionally becomes possible. Another reason is that an increase in the extent to which the piezoelectric element is deformed results in an increase in volumetric change in the pressure chamber, and hence the volume of droplet to be ejected or the volume of droplet to be delivered can be increased.

A piezoelectric element of multilayer structure has been proposed for sufficing for a characteristic pertaining to the compliance of the deformed portion and a characteristic pertaining to the extent to which the piezoelectric element becomes deformed, the characteristics being mutually contradictory. For example, piezoelectric elements disclosed in Japanese Patent Publications Nos. 2-289352A (page. 6; FIG. 5) and 10-34924A (page.5; FIG. 9) are formed from a piezoelectric layer having a two-layer structure: that is, an upper layer piezoelectric substance and a lower layer piezoelectric substance. Drive electrodes (individual electrodes) are formed at a boundary between the upper layer piezoelectric substance and the lower layer piezoelectric substance. A common electrode is formed on an outer surface of the upper layer piezoelectric substance, and another common electrode is formed on an outer surface of the lower layer piezoelectric substance.

In the case of the piezoelectric element of multilayer structure, the drive electrodes are provided at the boundary between the upper layer piezoelectric substance and the lower layer piezoelectric substance. Hence, an electric field, whose intensity is determined by an interval between the drive electrodes and the common electrodes (i.e., the thickness of each piezoelectric substance) and by a potential difference between the drive electrodes and the common electrodes, is imparted to the piezoelectric substances of respective layers. Therefore, in contrast with a piezoelectric element of monolayer structure formed by interposing a single layer piezoelectric substance between the common electrode and the drive electrodes, the piezoelectric element can be deformed at the same drive voltage as that conventionally required, even when the compliance of the deformed portion is reduced by increasing the entire thickness of the piezoelectric element to some extent.

However, characteristics capable of responding to recently-growing demand cannot be achieved by mere use of the piezoelectric element of multilayer structure. Therefore, users are forced to use, as an actual product, a piezoelectric element of monolayer structure formed by interposing a single layer piezoelectric substance between a common electrode and drive electrodes. Various factors are conceivable as being responsible for this, and insufficient efficiency of deformation of the piezoelectric element can be conceived as one such factor.

SUMMARY OF THE INVENTION

The present invention has been conceived in view of the foregoing circumstances and aims at improving the efficiency of deformation of a piezoelectric element of multilayer structure.

In order to achieve the above object, according to the invention, there is provided a piezoelectric element, comprising:

a first common electrode, to be fixed at a predetermined potential;

a first piezoelectric layer, laminated on the first common electrode and having a first deformability with respect to a predetermined voltage;

a drive electrode, laminated on the first piezoelectric layer, to which a drive signal is supplied externally;

a second piezoelectric layer, laminated on the drive electrode and having a second deformability with respect to the predetermined voltage which is larger than the first deformability; and a second common electrode, laminated on the second piezoelectric layer and to be fixed at the predetermined potential.

Preferably, the first piezoelectric layer has a first thickness, and the second piezoelectric layer has a second thickness which is not greater than a third forth of the first thickness.

Preferably, the first piezoelectric layer has a first piezoelectric constant, and the second piezoelectric layer has a second piezoelectric constant which is greater than the first piezoelectric constant.

According to the invention, there is also provided a piezoelectric element, comprising:

a first common electrode, to be fixed at a first potential;

a first piezoelectric layer, laminated on the first common electrode;

a drive electrode, laminated on the first piezoelectric layer, to which a drive signal is supplied externally;

a second piezoelectric layer, laminated on the drive electrode; and a second common electrode, laminated on the second piezoelectric layer and to be fixed at a second potential which is lower than the first potential.

According to the invention, there is also provided a piezoelectric actuator, comprising a vibration plate on which the above piezoelectric element is disposed.

According to the invention, there is also provided a liquid ejecting head, comprising the above piezoelectric actuator such that the piezoelectric element opposes to a chamber communicated with a nozzle orifice from which a liquid droplet is ejected.

In the above configurations, the degree of deformation of an upper layer piezoelectric substance stemming from supply of a drive signal is made greater than the degree of deformation of a lower layer piezoelectric substance. Hence, the piezoelectric element and the vibration plate can be deformed efficiently.

DETAILED DESCRIPTION OF THE PREFERRED EMBODIMENTS

Figure 15:
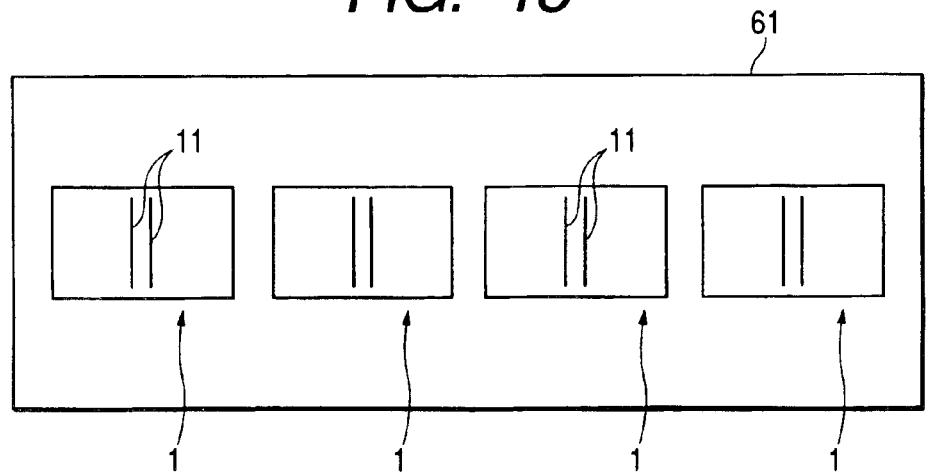
FIG. 15 is a plan view showing a recording head having a plurality of head main bodies.

Embodiments of the invention will be described hereinbelow by reference to the accompanying drawings. Here, the embodiments will be described by taking, as an example, a recording head (a kind of liquid ejecting head) to be mounted on an image recording apparatus such as a printer or a plotter. As shown in FIG. 15, for example, the recording head has a plurality of head main bodies 1, and the head main bodies 1 are mounted on a mount base 61.

Figure 1:
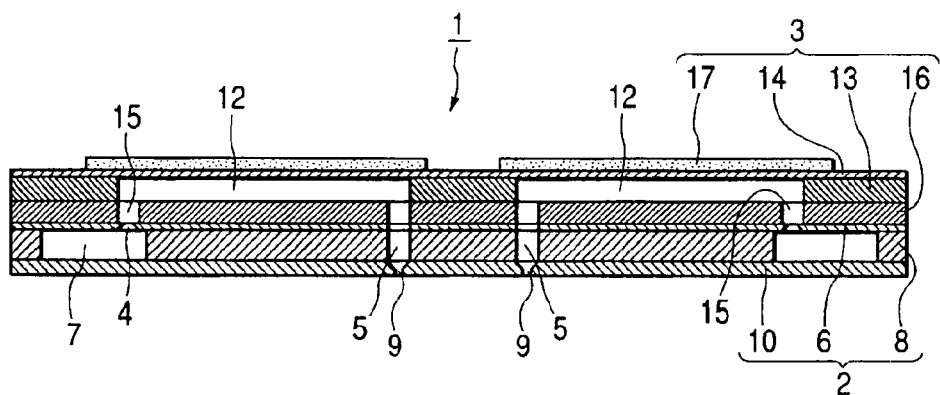
FIG. 1 is a cross-sectional view showing the basic structure of a head main body.

The basic structure of the head main body 1 will first be described. As shown in FIG. 1, the head main body 1 is essentially formed from a flow passage unit 2 and an actuator unit 3.

The flow passage unit 2 is fabricated from a supply port formation substrate 6 having formed therein through holes which are to serve as ink supply ports 4, and through holes which are to constitute portions of nozzle communication ports 5; a reservoir formation substrate 8 having formed therein through holes which are to serve as a common reservoir 7, and through holes which are to constitute portions of the nozzle communication ports 5; and a nozzle plate 10 having formed therein nozzle orifices 9 oriented in a secondary scanning direction (i.e., a direction orthogonal to a primary scanning direction in which a recording head is to move). The supply port formation substrate 6, the reservoir formation substrate 8, and the nozzle plate 10 are formed by pressing, for example, a stainless steel plate.

The flow passage unit 2 is fabricated by placing the nozzle plate 10 on one surface of the reservoir formation substrate 8 (e.g., a lower side in the drawing) and the supply port formation substrate 6 on the other surface of the same (e.g., an upper side in the drawing), and bonding together the supply port formation substrate 6, the reservoir formation substrate 8, and the nozzle plate 10. For instance, the flow passage unit 2 is fabricated by bonding together the members 6, 8, and 10 by use of, e.g., a sheet-shaped adhesive.

Figure 2:
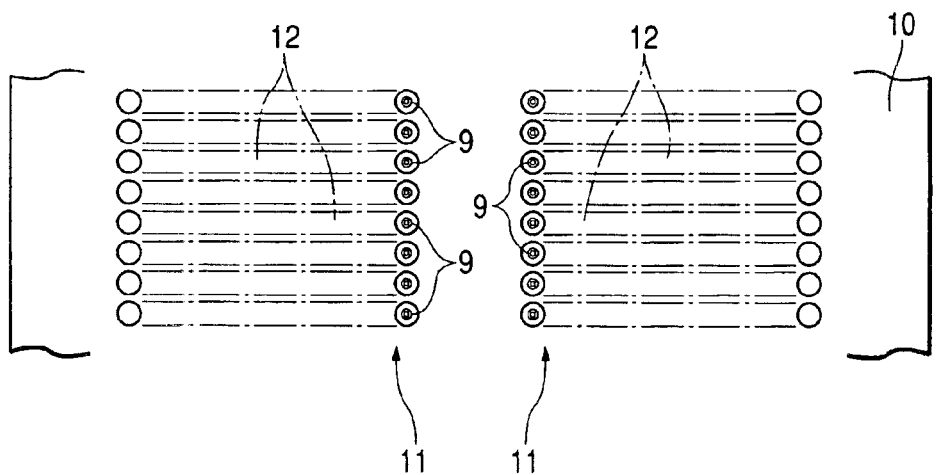
FIG. 2 is a plan view of the head main body when viewed from a nozzle plate.

As shown in FIG. 2, the nozzle orifices 9 are formed in a plurality of rows at predetermined pitches. Rows of nozzles 11 are formed from the plurality of nozzle orifices 9 arranged in rows. For example, a row of nozzles 11 is formed from 92 nozzle orifices 9. Two rows of nozzles 11 are formed side by side.

The actuator unit 3 is a member also called a head chip. The actuator unit 3 comprises a pressure chamber formation substrate 13 having formed therein through holes which are to constitute pressure chambers 12; a vibration plate 14 for partitioning a part of each pressure chamber 12; a cover member 16 having formed therein through holes which are to constitute portions of supply-side communication ports 15, and through holes which are to constitute portions of the nozzle communication ports 5; and a piezoelectric element 17. With regard to the thicknesses of the members 13, 14, and 16, the pressure chamber formation substrate 13 and the cover member 16 preferably assume a thickness of 50 μm or more, more preferably, 100 μm or more. The vibration plate 14 preferably assumes a thickness of 50 μm or less, more preferably 3 to 12 μm or thereabouts.

In the actuator unit 3, the vibration plate 14 and the piezoelectric element 17 constitute a piezoelectric actuator of the invention. The vibration plate 14 is a kind of support member on which the piezoelectric element 17 is to be provided.

The actuator unit 3 is made by bonding the cover member 16 to one surface of the pressure chamber formation substrate 13 and the vibration plate 14 to the other surface of the same, and by forming the piezoelectric element 17 on the surface of the vibration plate 14. Of these members, the pressure chamber formation substrate 13, the vibration plate 14, and the cover member 16 are made from ceramics such as alumina or zirconia by sintering.

The pressure chamber formation substrate 13, the vibration plate 14, and the cover member 16 are bonded together in accordance with the following procedures. First, ceramic slurry is prepared from ceramic material, a binder, a liquid medium, or the like. Next, a green sheet (i.e., a sheet material which has not yet been sintered) is formed from the slurry through use of a common apparatus such as a doctor blade apparatus or a reverse roll coater. Subsequently, the green sheet is subjected to processing, such as cutting or punching, thereby forming required through holes. Thus, sheet-shaped precursors for the pressure chamber formation substrate 13, the vibration plate 14, and the cover member 16 are formed. The sheet-shaped precursors are laminated and sintered, thereby integrating the sheet-shaped precursors and producing a single sheet-shaped member. In this case, since the sheet-shaped precursors are formed integrally, special bonding operation is not necessary. Moreover, a high sealing characteristic can be achieved at cemented surfaces of the respective sheet-shaped precursors.

The pressure chambers 12 and the nozzle communication ports 5, which are equal in number to units, are formed in one sheet-shaped member. Specifically, a plurality of actuator units (head chips) 3 are formed from one sheet-shaped member. For instance, a plurality of chip regions 19 (see FIG. 13), which are to become single actuator units 3, are set in a matrix pattern within one sheet-shaped member. Required members, such as the piezoelectric element 17, are formed in each chip region 19. The sheet-shaped member (i.e., a ceramics sheet 18) on which the required members are formed is cut for each chip region 19, thereby producing a plurality of actuator units 3. A method for manufacturing the actuator units 3 will be described later.

The pressure chamber 12 is a hollow section which is elongated in the direction orthogonal to the row of nozzles 11, and a plurality of pressure chambers 12 are formed so as to correspond to the nozzle orifices 9. Specifically, as shown in FIG. 2, the pressure chambers 12 are arranged in rows in line with the row of nozzles. One end of each pressure chamber 12 is in communication with the corresponding nozzle orifice 9 by way of the nozzle communication port 5. The other end on the side of the pressure chamber 12 opposite the nozzle communication port 5 is in communication with the common reservoir 7 by way of the supply-side communication port 15 and the ink supply port 4. A part of the pressure chamber 12 is partitioned by the vibration plate 14.

Figure 3:
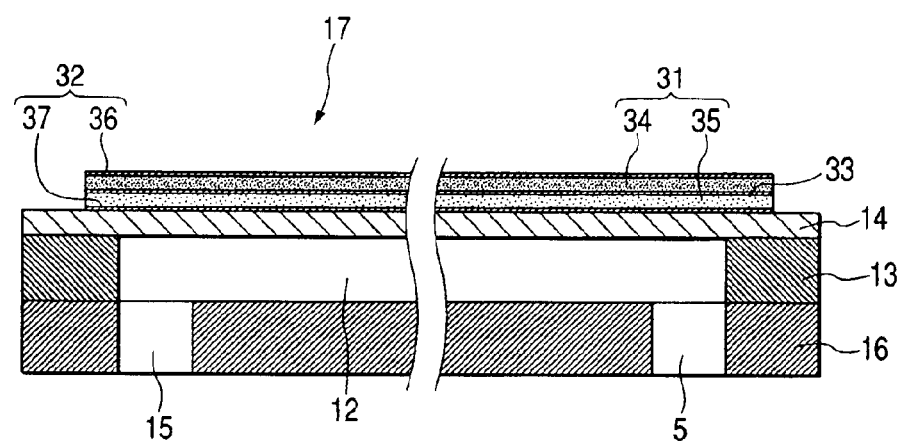
FIG. 3 is a cross-sectional view of a pressure chamber of an actuator unit according to a first embodiment of the invention, taken along the longitudinal direction of the pressure chamber.

Here, the piezoelectric element 17 is a piezoelectric element of so-called flexural vibration mode and is provided, for each pressure chamber 12, on the surface of the vibration plate 14 opposite the pressure chamber 12. The piezoelectric element 17 is substantially identical in width with the pressure chamber 12 and somewhat greater in length than the same. More specifically, the piezoelectric element 17 is formed so as to cover the pressure chamber 12 in the longitudinal direction thereof. For instance, as shown in FIG. 3, the piezoelectric element 17 has a multilayer structure formed from a piezoelectric substance layer 31, a common electrode 32, a drive electrode 33, and the like. The piezoelectric substance layer 31 is sandwiched between the drive electrode 33 and the common electrode 32. The detailed structure of the piezoelectric element 17 will be described later in detail.

A drive signal supply source (not shown) is electrically continuous with or connected to the drive electrode 33. The common electrode 32 is controlled to a given potential (e.g., a ground potential). When a drive signal is supplied to the drive electrode 33, an electric field whose intensity is related to a potential difference between the drive electrode 33 and the common electrode 32 is generated. Since the electric field is imparted to the piezoelectric substance layer 31, the piezoelectric substance layer 31 becomes deformed in accordance with the intensity of the imparted electric field. More specifically, as the electric potential of the drive electrode 33 increases, the piezoelectric substance layer 31 contracts in the direction orthogonal to the electric field, thereby deforming the vibration plate 14 such that the volume of the pressure chamber 12 is reduced. As the electric potential of the drive electrode 33 is reduced, the piezoelectric substance layer 31 expands in the direction orthogonal to the electric field, thereby deforming the vibration plate 14 such that the volume of the pressure chamber 12 is increased.

The actuator unit 3 and the flow passage unit 2 are bonded together. For instance, a sheet-shaped adhesive is interposed between the supply port formation substrate 6 and the cover member 16. In this state, pressure is applied to the actuator unit 3 toward the flow passage unit 2, whereupon the actuator unit 3 and the flow passage unit 2 are bonded together.

In the head main body 1 having such a construction, a continuous ink flow passages are formed so as to extend from the common reservoir 7 to the nozzle orifice 9 by way of the ink supply port 4, the supply-side communication port 15, the pressure chamber 12, and the nozzle communication port 5. When the actuator unit is in use, the inside of the ink flow passage is filled with ink (a kind of liquid). As a result of the piezoelectric element 17 having become deformed, a corresponding pressure chamber 12 is subjected to contraction or expansion, thereby causing pressure fluctuations in the ink stored in the pressure chamber 12. By controlling the ink pressure, the nozzle orifice 9 can be caused to eject an ink droplet. For instance, if the pressure chamber 12 having a stationary volume is subjected to rapid expansion once having been contracted, the pressure chamber 12 is filled with ink in association with the expansion of the pressure chamber 12. By subsequent rapid contraction, the ink stored in the pressure chamber 12 is pressurized, whereupon an ink droplet is ejected.

Here, high-speed recording operation involves a necessity for ejecting a larger number of ink droplets within a short time period. In order to satisfy this requirement, the compliance of the vibration plate 14 and that of the piezoelectric element 17 (i.e., a deformed portion of the pressure chamber 12), both elements partitioning the pressure chamber 12, and the amount of deformation of the piezoelectric element 17 must be taken into consideration. More specifically, as the compliance of the deformed portion becomes greater, responsiveness of the pressure chamber to deformation is deteriorated, whereby driving of the recording head at a high frequency becomes difficult. In contrast, as the compliance of the deformed portion becomes smaller, deformation of the pressure chamber becomes more difficult, whereby the amount of contraction of the pressure chamber 12 becomes smaller and the volume of one ink droplet is also decreased.

From this viewpoint, in the case of a recording head employing a piezoelectric element of flexural vibration mode which has already become commercially practical, there is employed a piezoelectric element of monolayer structure formed by interposing a single layer of piezoelectric substance between a common electrode and a drive electrode. The piezoelectric element has a maximum response frequency of about 25 kHz and a maximum ink droplet volume of about 13 pL (picoliters).

In the embodiment, the compliance of the vibration plate 14 is reduced by use of the piezoelectric element 17 of multilayer structure. Further, the piezoelectric element 17 is improved. Thus, the recording head of the invention can eject the required volume of ink droplet more efficiently than does the related-art recording head. The following description explains this point.

First, the structure of the piezoelectric element 17 is described in detail. As shown in FIG. 3, the piezoelectric substance layer 31 is formed from an upper layer piezoelectric substance (i.e., an outer piezoelectric substance) 34 and a lower layer piezoelectric substance (i.e., an inner piezoelectric substance) 35. The common electrode 32 is formed from an upper common electrode (i.e., an outer common electrode) 36 and a lower common electrode (i.e., an inner common electrode) 37. The common electrode 32 and a drive electrode (individual electrodes) 33 constitute an electrode layer.

Here, the terms "upper (or outer)" and "lower (or inner)" denote a positional relationship with reference to the vibration plate 14. In other words, the terms denote a positional relationship with reference to the surface of the piezoelectric element 17 cemented to the vibration plate 14 (which can also be expressed as an operating surface to be used for deforming the piezoelectric element 17, to thereby produce an output). The term "upper (outer)" denotes the surface of the piezoelectric element distant from the vibration plate 14, and the term "lower (inner)" denotes the surface of the same close to the vibration plate 14.

The drive electrode 33 is formed at a boundary between the upper layer piezoelectric substance 34 and the lower layer piezoelectric substance 35. The lower common electrode 37 is formed between the lower layer piezoelectric substance 35 and the vibration plate 14. Further, the upper common electrode 36 is formed on the upper surface of the upper layer piezoelectric substance 34. Specifically, the piezoelectric element 17 has a multilayer structure comprising, in order from the vibration plate 14, the lower common electrode 37, the lower layer piezoelectric substance 35, the drive electrode 33, the upper layer piezoelectric substance 34, and the upper common electrode 36. The thickness of the piezoelectric substance layer 31 is equal to a total thickness of the upper layer piezoelectric substance 34 and the lower layer piezoelectric substance 35: that is, about 17 $\mu$m. Further, the total thickness of the piezoelectric element 17, including the common electrode 32, is about 20 $\mu$m.

The total thickness of the conventional piezoelectric element 17 of monolayer structure is about 15 $\mu$m. Accordingly, as the thickness of the piezoelectric element 17 is increased, the compliance of the vibration plate 14 becomes smaller correspondingly.

The upper common electrode 36 and the lower common electrode 37 are controlled to a given potential regardless of the drive signal and serve as common electrodes as mentioned above. In the embodiment, the upper common electrode 36 and the lower common electrode 37 are electrically connected together and controlled to the earth potential. The drive electrode 33 is electrically connected to the drive signal supply source and changes a potential in accordance with a supplied drive signal. Accordingly, supply of the drive signal induces an electric field between the drive electrode 33 and the upper common electrode 36 and between the drive electrode 33 and the lower common electrode 37, wherein the electric fields are opposite in direction to each other.

Various conductors; e.g., a single metal substance, a metal alloy, or a mixture consisting of electrically insulating ceramics and metal, are selected as materials which constitute the electrodes 33, 36, and 37. The materials are required not to cause any deterioration at a sintering temperature. In the embodiment, gold is used for the upper common electrode 36, and platinum is used for the lower common electrode 37 and the drive electrode 33.

The upper layer piezoelectric substance 34 and the lower layer piezoelectric substance 35 are formed from piezoelectric material containing, e.g., lead zirconate titanate (PZT) as the main ingredient. The direction of polarization of the upper layer piezoelectric substance 34 is opposite that of the lower layer piezoelectric substance 35. Therefore, when the drive signal is applied to the upper layer piezoelectric substance 34 and the lower layer piezoelectric substance 35, the substances expand and contract in the same direction and can become deformed without any problem. The upper layer piezoelectric substance 34 and the lower layer piezoelectric substance 35 deform the vibration plate 14 such that the volume of the pressure chamber 12 is reduced with an increase in the potential of the drive electrode 33 and such that the volume of the pressure chamber 12 is increased with a decrease in the potential of the drive electrode 33.

In order to efficiently deform the piezoelectric element 17 of multilayer structure, the degree of deformation of the upper layer piezoelectric substance 34 stemming from supply of the drive signal is made greater than that of the lower piezoelectric substance 35. In short, the degree of deformation of the upper layer piezoelectric substance 34 located distant from the vibration plate 14 is made greater than that of the lower piezoelectric substance 35 located close to the same.

Figure 4:
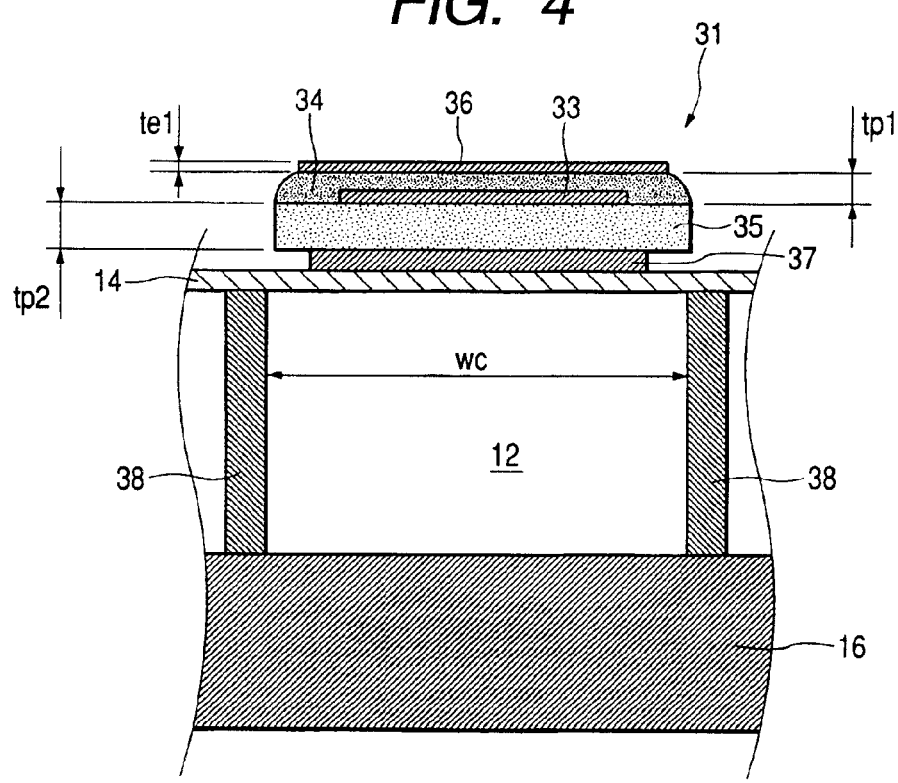
FIG. 4 is a cross-sectional view of the actuator unit of the first embodiment taken across the pressure chamber of the actuator unit of the first embodiment.

For example, the electric field developing between the drive electrode 33 and the upper common electrode 36 is made more intense than that developing between the drive electrode 33 and the lower common electrode 37, whereby the degree of deformation of the upper layer piezoelectric substance 34 can be made greater than that of the lower layer piezoelectric substance 35. Therefore, the thickness tp1 of the upper layer piezoelectric substance 34 is set to three-fourths the thickness tp2 of the lower layer piezoelectric substance 35 (see FIG. 4). As mentioned above, the total thickness (tp1+tp2) is 17 $\mu$m.

As a result of the thickness of the upper layer piezoelectric substance 34 being set to three-fourths or less the thickness of the lower layer piezoelectric substance 35, the interval between the drive electrode 33 and the upper common electrode 36 becomes smaller than the interval between the drive electrode 33 and the lower common electrode 37 in accordance with a difference in thickness between the upper layer piezoelectric substance 34 and the lower layer piezoelectric substance 35. Therefore, the electric field developing between the drive electric field 33 and the upper common electrode 36 becomes more intense than that developing between the drive electric field 33 and the lower common electrode 37. Thus, the upper layer piezoelectric substance 34 becomes deflected to a greater extent than is the lower layer piezoelectric substance 35.

Figure 5:
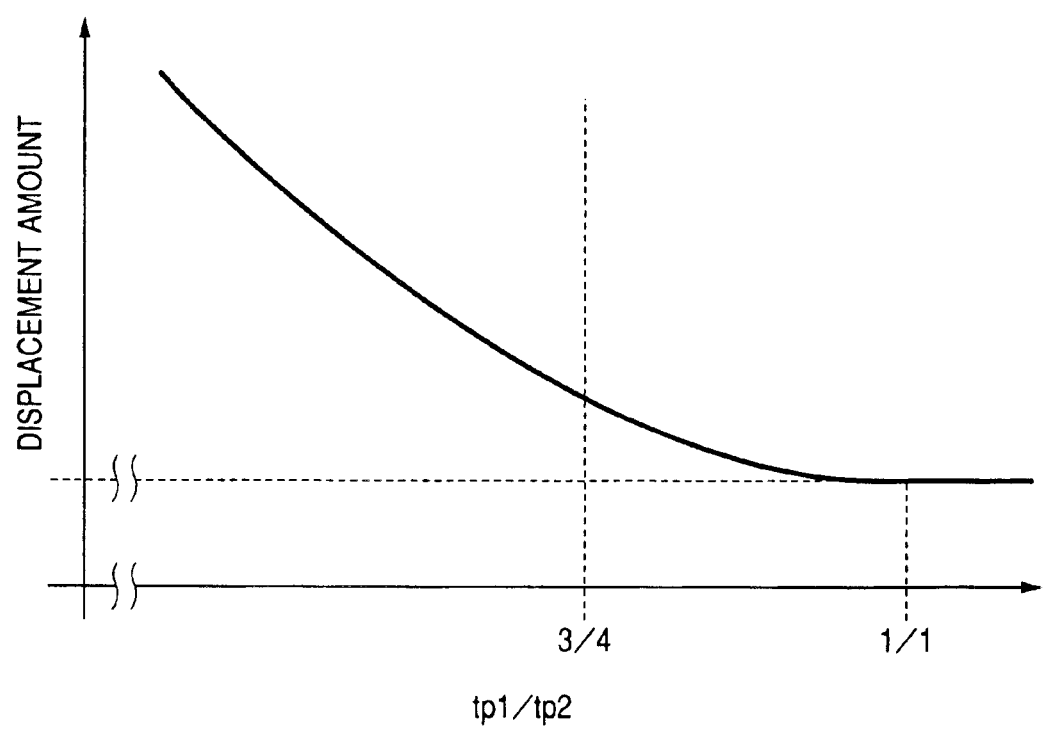
FIG. 5 is a view showing the correlation between a thickness ratio between layers of piezoelectric substances and the amount of displacement.

The reason why the thickness of the upper layer piezoelectric substance 34 is set to three-fourths the thickness of the lower layer piezoelectric substance 35 is for ensuring a sufficient amount of deformation of the piezoelectric element 17. FIG. 5 is a graph showing the amount of displacement of the piezoelectric element 17 achieved when the ratio of the thickness of the upper layer piezoelectric substance 34 to the thickness of the lower layer piezoelectric substance 35 (tp1/tp2) is changed. The graph shows a result of a test performed when the drive voltage is maintained constant. As can be seen from FIG. 5, when the thickness ratio is greater than a value of three-fourths, no noticeable difference is found in the amount of displacement. However, when the thickness ratio is set to a value of three-fourths or less, a noticeable effect of the ability to increase the amount of displacement is yielded.

When the upper layer piezoelectric substance 34 has become deflected to a greater extent than the lower layer piezoelectric substance 35, the upper layer piezoelectric substance 34 is spaced farther from the vibration plate 14 than is the lower layer piezoelectric substance 35, and hence, deformation of the upper layer piezoelectric 34 acts on the vibration plate 14 while the amount of deformation is amplified. Thus, the amount of deformation of the vibration plate 14 can be increased. For instance, the piezoelectric element 17 is compared with a comparative piezoelectric element, wherein the piezoelectric elements are equal in terms of the thickness of the upper layer piezoelectric substance 34 stacked on the lower layer piezoelectric substance 35 (i.e., the thickness of the piezoelectric element 17), width, and length; and wherein the upper layer piezoelectric substance 34 of the comparative piezoelectric element is greater in thickness than the lower layer piezoelectric substance 35.

In the case of the piezoelectric element 17 of the embodiment, the upper layer piezoelectric substance 34 involving a greater amount of deflection is located distant from the vibration plate 14. In the case of the comparative piezoelectric element, the lower layer piezoelectric substance 35 involving a relatively large amount of deformation is located in close proximity to the vibration plate 14. The greater the distance between vibration plate 14 and the piezoelectric substance layer involving a larger amount of deformation, the greater the extent to which the vibration plate 14 can be deformed. Therefore, the piezoelectric element 17 of the embodiment can deform the vibration plate 14 to a greater extent than does the comparative piezoelectric element.

Since the comparative piezoelectric element is identical with the piezoelectric element 17 in terms of height, width, and length, the piezoelectric element 17 of the embodiment and the comparative piezoelectric element have the same electrostatic capacitance.

The vibration plate 14 can be deformed greatly, and hence the volume of the pressure chamber 12, which would be achieved at the time of contraction of the piezoelectric element, can be made smaller. Accordingly, a volumetric difference between the expanded pressure chamber 12 and the contracted pressure chamber 12 can be made greater than when the piezoelectric element 17 of multilayer structure is simply used, thereby increasing the quantity of ink droplet to be ejected.

In the embodiment, the vibration plate 14 is greatly deformed by use of a piezoelectric material (i.e., lead zirconate titanate) having the same deflection characteristic for the upper layer piezoelectric substance 34 and the lower layer piezoelectric substance 35, and by changing the thicknesses of the respective piezoelectric substance layers 31 (i.e., 34, 35). However, the invention is not limited to such a construction. For instance, the upper layer piezoelectric substance 34 may be formed from a piezoelectric material which is greater in piezoelectric constant than the lower layer piezoelectric substance 35. When the piezoelectric element is formed in this way, the amount of deformation of the upper layer piezoelectric substance 34 can be made greater than that of the lower layer piezoelectric substance 35 even when the respective layer piezoelectric substances have the same thickness (i.e., an electric field of the same intensity is imparted). Thus, a working-effect identical with that achieved in the embodiment can also be achieved.

For example, the piezoelectric constant of lead zirconate titanate [$Pb(Zr_xTi_{1-x})O_3$], which is one type of piezoelectric material, can be changed by changing the additive proportions between Zr and Ti. For example, when Zr and Ti are added to the lead zirconate titanate in proportions of 52:48, the resultant piezoelectric constant (d31) assumes a value of $93.5 \times 10^{-12}$. When Zr and Ti are added in proportions of 60:40, the resultant piezoelectric constant assumes a value of $44.2 \times 10^{-12}$. The piezoelectric constant also changes in accordance with a change in sintering environment, such as a change in temperature or humidity.

Two types of lead zirconate titanate, which have been prepared so as to assume a desired piezoelectric constant, are used for the upper layer piezoelectric substance 34 and the lower layer piezoelectric substance 35. As a result, the amount of deformation of the upper layer piezoelectric substance 34 can be made greater than that of the lower layer piezoelectric substance 35.

The piezoelectric constant also changes according to the type of piezoelectric material. Therefore, the upper and lower layer piezoelectric substances 34, 35 may be formed from different piezoelectric materials. For instance, piezoelectric materials other than lead zirconate titanate include lead niobate magnesium, lead niobate nickel, lead niobate manganese, lead stannate antimony, lead niobate zinc, and lead titanate. Two arbitrary types of piezoelectric materials may be selected from these materials, and the upper and lower layer piezoelectric substances 34, 35 may be formed from the thus-selected piezoelectric materials.

As will be described later, the piezoelectric element 17 is formed by repeatedly performing coating and sintering of a paste on a per-layer basis. Therefore, in relation to the upper layer piezoelectric substance 34, the smaller the residual stress arising after the piezoelectric element has been sintered, the larger the amount of deformation stemming from the electric field. In view of this point, the upper layer piezoelectric substance 34 is preferably formed from material which is lower in heat contraction rate than material of the lower layer piezoelectric substance 35; that is, material having small residual stress which would arise after sintering.

For example, the contraction rate of the lead zirconate titanate [$Pb(Zr_xTi_{1-x})O_3$] can also be changed by changing the additive proportions between Zr and Ti. For example, when the piezoelectric element to which Zr and Ti have been added in proportions of 22:78 is compared with the piezoelectric element to which Zr and Ti have been added in proportions of 40:60, the piezoelectric element including Zr and Ti in proportions of 22:78 exhibits a contraction rate greater than that of the piezoelectric element including Zr and Ti in proportions of 40:60. Further, the contraction rate also changes according to a sintering temperature. Therefore, the lead zirconate titanate whose additive proportions and sintering temperature have been controlled so as to assume a desired contraction rate is used for making the upper layer piezoelectric substance 34, thereby controlling the resultant residual stress of the piezoelectric substance.

The contraction rate also changes from one piezoelectric material to another. Therefore, the same effect can be yielded by use of a piezoelectric material which provides a desired contraction rate for the upper and lower layer piezoelectric substances 34, 35.

An electrode material which is thinner and more flexible than those of the other electrodes (i.e., the drive electrode 33 and the lower common electrode 37) is used for the upper common electrode 36, in view that the upper common electrode 36 deforms to a greater extent than the other electrodes. Specifically, the upper common electrode 36 is formed on the surface of the upper layer piezoelectric substance 34 and becomes deformed to a greater extent than the other electrodes. For this reason, a material which is softer than those used for the other electrodes is used for the upper common electrode 36 and/or in a small thickness. As a result, there can be prevented occurrence of a rupture, which would otherwise be caused by repeated deformation. In order to prevent an excessive increase in electrical resistance, which would otherwise arise when the thickness of the upper common electrode is reduced, an electrode material having superior conductivity is preferably used.

More specifically, as mentioned above, in relation to the material of an electrode, the upper common electrode 36 is formed from gold, and the drive electrode 33 and the lower common electrode 37 are formed from platinum. In relation to the thicknesses of the electrodes, the lower common electrode 37 and the drive electrode 33 assume a thickness of 2 to 3 $\mu$m, and the upper common electrode 36 assumes a thickness (te1) which is about one-tenth the value of 2 to 3 $\mu$m (e.g., 0.3 $\mu$m).

By such a configuration, the upper common electrode 36 can be deformed so as to follow the piezoelectric element 17, thereby preventing occurrence of a problem; that is, impairment of the amount of deformation of the piezoelectric element 17. Further, even when being deformed repeatedly, the piezoelectric element 17 is less susceptible to a break in wiring. Moreover, an electric current can be caused to efficiently flow through the upper common electrode 36.

Figure 6:
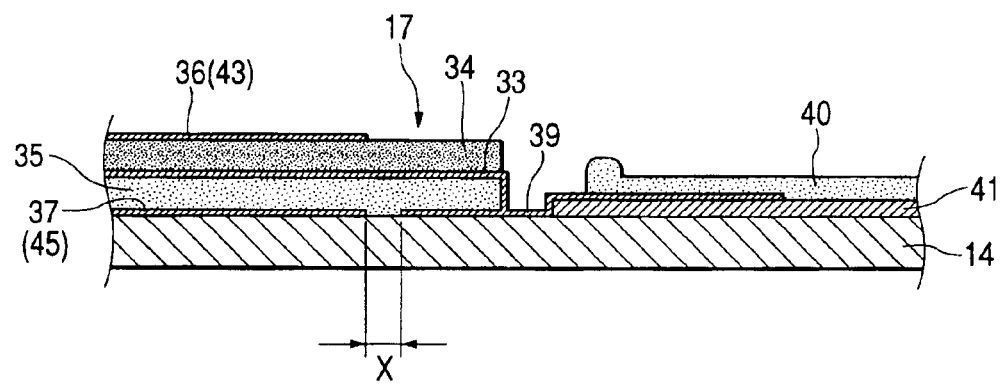
FIG. 6 is a cross-sectional view showing the terminal structure of a drive electrode provided in the actuator unit of the first embodiment.
Figure 7:
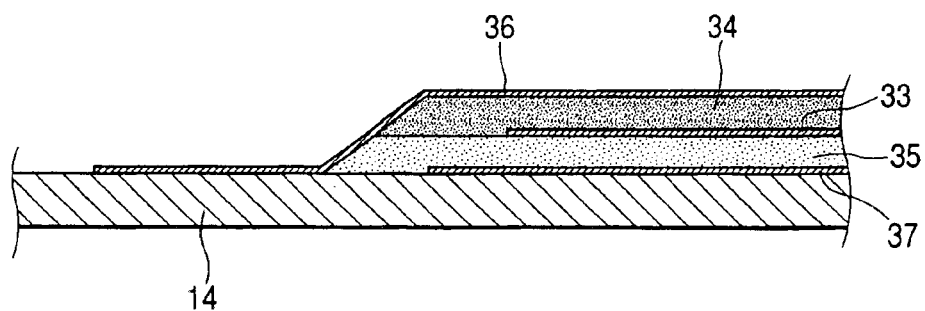
FIG. 7 is a cross-sectional view showing the terminal structure of a common electrode provided in the actuator unit of the first embodiment.

As shown in FIG. 6, the drive electrode 33 becomes exposed outside at one longitudinal end of the piezoelectric element 17 and is electrically connected to a feed terminal 40 by way of a conduction electrode 39. The feed terminal 40 is a contact terminal to be used for supplying a drive signal. A plurality of feed terminals 40 are formed for each drive electrode 33. Contact terminals (not shown) to be used for feeding a drive signal provided in a flexible flat cable (FFC) are electrically connected to the respective feed terminals 40. Accordingly, the drive signal is supplied to a corresponding drive electrode 33 by way of the feed terminal 40 and the conduction electrode 39.

The conduction electrode 39 is continuously formed on an end face of the piezoelectric element 17, the surface of the vibration plate 14, and the surface of a terminal substrate 41 on which the feed terminal 40 is to be provided. As mentioned above, the lower common electrode 37 is also formed on the surface of the vibration plate 14. However, a disconnection region X where no electrode is to be formed is set between the conduction electrode 39 and the lower common electrode 37. Hence, the conduction electrode 39 and the lower common electrode 37 are electrically isolated from each other.

As mentioned above, the piezoelectric element 17 is provided for each nozzle orifice 9. Hence, the number of piezoelectric elements 17 to be provided for one row of nozzles 11 is 92. Although the upper common electrode 36 and the lower common electrode 37 are electrically connected together, a working efficiency will be deteriorated if the common electrodes 36, 37 are electrically connected together for each piezoelectric element 17, thereby resulting in a failure to improve productivity.

In contrast, if the common electrodes 36, 37 are electrically connected together at the time of formation of the common electrode 32 (formed from the electrodes 36, 37), only the total electrostatic capacity of the piezoelectric element 17 can be measured at the time of measurement of electrostatic capacity of the piezoelectric substance layer 31 in a subsequent inspection process for each piezoelectric element 17 (i.e., for each pressure chamber 12), thus posing difficulty in determining the location of a problem. Moreover, if either the upper layer piezoelectric substance 34 or the lower layer piezoelectric substance 35 is insufficiently polarized, addressing the problem will become difficult.

In view of the circumstances, in the embodiment, the upper common electrode 36 and the lower common electrode 37 are formed from a pectinated electrode consisting of a trunk electrode and a plurality of prong electrodes. After the electrostatic capacitance of the piezoelectric substance layer 31 has been measured, the trunk electrodes are electrically connected together. The common electrode 32 will be described hereinbelow.

Figure 8A:
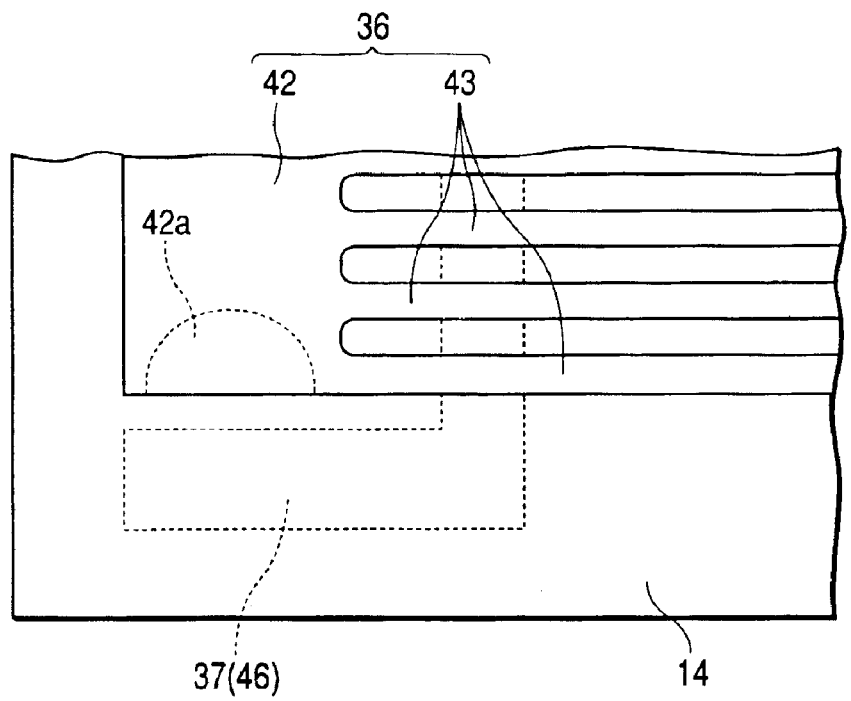
FIG. 8A is a plan view of an upper common electrode provided in the actuator unit of the first embodiment.

As shown in FIG. 8A, the upper common electrode 36 is formed from a straight swath trunk electrode (proximal electrode) 42 which is elongated in the direction of a nozzle row; and a plurality of prong electrodes 43 which are continuously formed on one side of the trunk electrode 42 so as to cover the surface of the piezoelectric element 17 (i.e., the upper layer piezoelectric substance 34). The upper common electrode 36 is formed in a pectinated pattern.

The trunk electrode 42 is formed on the surface of the vibration plate 14, and the width of the trunk electrode 42 is set so as to become sufficiently greater than the width of the prong electrode 43 so that an electric current can be caused to flow to the prong electrodes without a problem even when the drive signals are simultaneously supplied to all the piezoelectric elements 17. As indicated by dotted lines in FIG. 8A, a conduction area 42a is provided at the longitudinal end of the trunk electrode 42. The conduction area 42a is used for bringing the upper common electrode 36 and the lower common electrode 37 into conduction with each other (to be described later). The respective prong electrodes 43 are formed on the surface of the upper layer piezoelectric substance 34 so as to run over a tilt surface formed at one end of the piezoelectric substance layer 31 (i.e., an end section of the piezoelectric substance layer 31 close to the trunk electrode 42).

As shown in FIG. 6, the extremities of the respective prong electrodes 43 (i.e., extremities of the same opposite the trunk electrode 42) are located at positions inward of the other end of the upper layer piezoelectric substance 34. This is intended for preventing occurrence of a failure, which would otherwise arise when a short-circuit arises between the prong electrodes 43 and the drive electrode 33 by air discharge as a result of the extremities of the prong electrodes 43 having been spaced from the drive electrode 33.

Figure 8B:
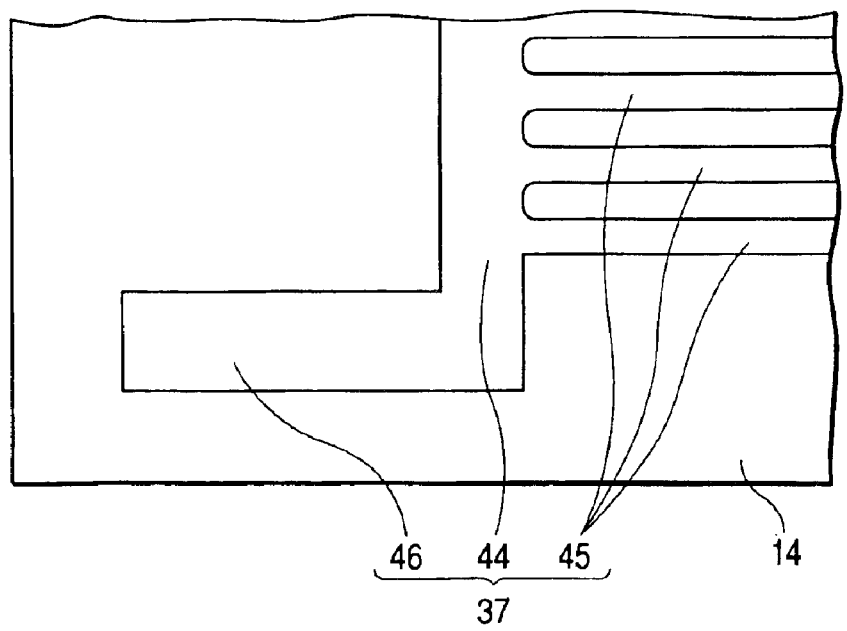
FIG. 8B is a plan view of a lower common electrode provided in the actuator unit of the first embodiment.

The entirety of the lower common electrode 37 is formed on the surface of the vibration plate 14. As shown in FIG. 8B, the lower common electrode 37 is formed into a pectinated pattern from a straight swath trunk electrode (proximal electrode) 44 which is elongated in the direction of the nozzle row; a plurality of prong electrodes 45 on one side of the trunk electrode 44 for respective piezoelectric elements 17 (i.e., the lower layer piezoelectric substance 35); and a conduction strip section 46 extending from one end of the trunk electrode 44 in the direction opposite the prong electrodes 45.

The width of the trunk electrode 44 is set so as to become sufficiently greater than the width of the prong electrode 45 so that an electric current can be caused to flow to the prong electrodes without a problem even when the drive signals are not simultaneously supplied to all the piezoelectric elements 17. The prong electrodes 45 are located between the piezoelectric substance layer 31 (i.e., the lower layer piezoelectric substance 35) and the vibration plate 14, and extremities of the prong electrodes 45 (i.e., ends of the prong electrodes opposite the trunk electrode 44) are aligned with the upper common electrode 36, as shown in FIG. 6. The conduction strip section 46 is used for bringing the lower common electrode 37 into conduction with the upper common electrode 36. The conduction strip section 46 is formed at a position close to the conduction area 42a of the upper common electrode 36. As shown in FIG. 9F, a conduction member 47, such as solder, is provided so as to spread across the conduction area 42a and the conduction strip section 46. Consequently, electrical connection of the common electrodes 36, 37 can be achieved by only forming the conduction member 47 so as to spread across the conduction area 42a and the conduction strip section 46, thereby enabling simplification of work. This structure is suitable for automating operations for assembling piezoelectric elements.

Procedures for forming the upper common electrode 36 and the lower common electrode 37 will now be described. The common electrodes 36, 37 are formed through an element formation process for forming the piezoelectric element 17 on the vibration plate 14. The element formation process will now be described.

Figure 9A:
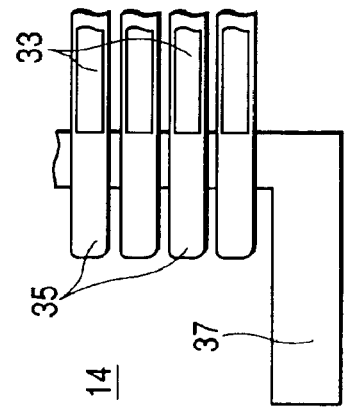
FIGS. 9A to 9F are plan views showing the process for fabricating a piezoelectric element.

As shown in FIG. 9A, the lower common electrode 37 is formed on the surface of the vibration plate 14 through the element formation process. In the embodiment, the lower common electrode 37 is formed by printing (thick film printing). First, a mask is placed at a predetermined location on the vibration plate 14, and a platinum paste is applied over the surface of the vibration plate 14 via the mask. So long as the platinum paste has been applied, the platinum paste is sintered. More specifically, the ceramic sheet 18 to which the platinum paste has been applied is sintered in a baking furnace at a predetermined temperature over a predetermined time period. By the sintering operation, the lower common electrode 37 is formed on the surface of the vibration plate 14.

Figure 9B:
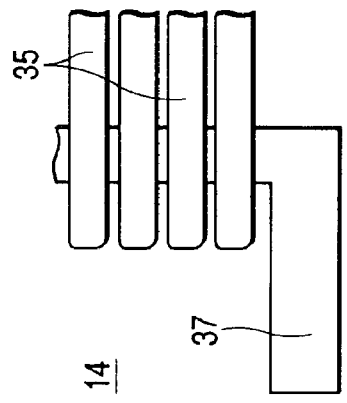
Figure 9C:
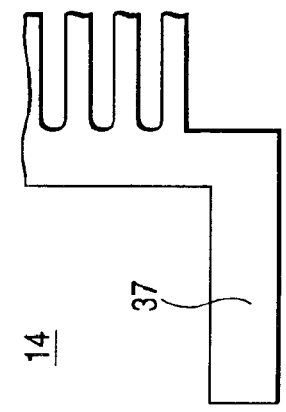
Figure 9D:
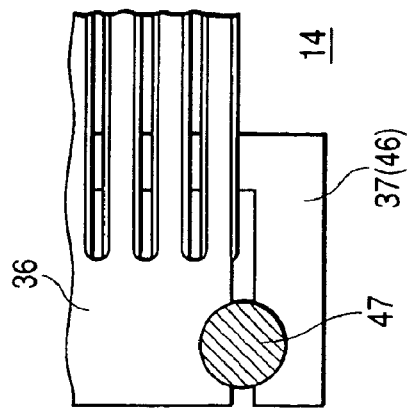
Figure 9E:
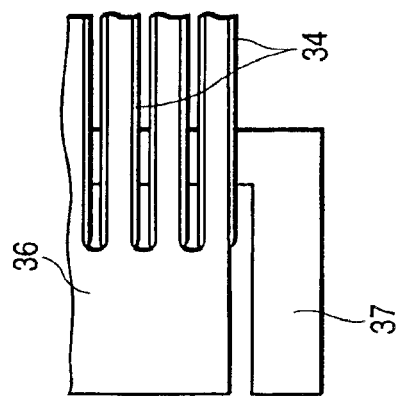
Figure 9F:
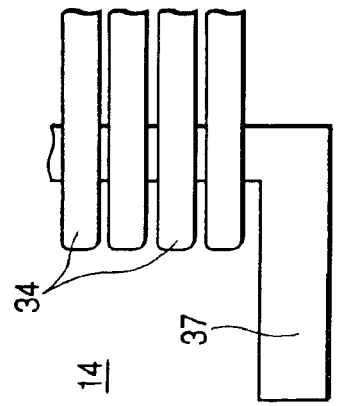

As shown in FIG. 9B, when the lower common electrode 37 has been formed, the lower layer piezoelectric substance 35 is formed. Namely, after a mask has been placed at a predetermined location on the vibration plate 14, a piezoelectric material (e.g., lead zirconate titanate) paste is applied over the common under electrode 37. The thus-applied piezoelectric material paste is sintered. Subsequently, as shown in FIGS. 9C to 9E, the drive electrode 33, the upper layer piezoelectric substance 34, and the upper common electrode 36 are formed, in this sequence, through the same procedures. In a third process, the drive electrodes 33 are stacked on the lower piezoelectric substances 35. In a fourth process, the upper layer piezoelectric substances 34 are formed on the lower layer piezoelectric substances 35 so as to cover the drive electrodes 35. In a fifth process, the upper common electrode 36 is formed on the surface of the upper piezoelectric substances 34.

Figure 13:
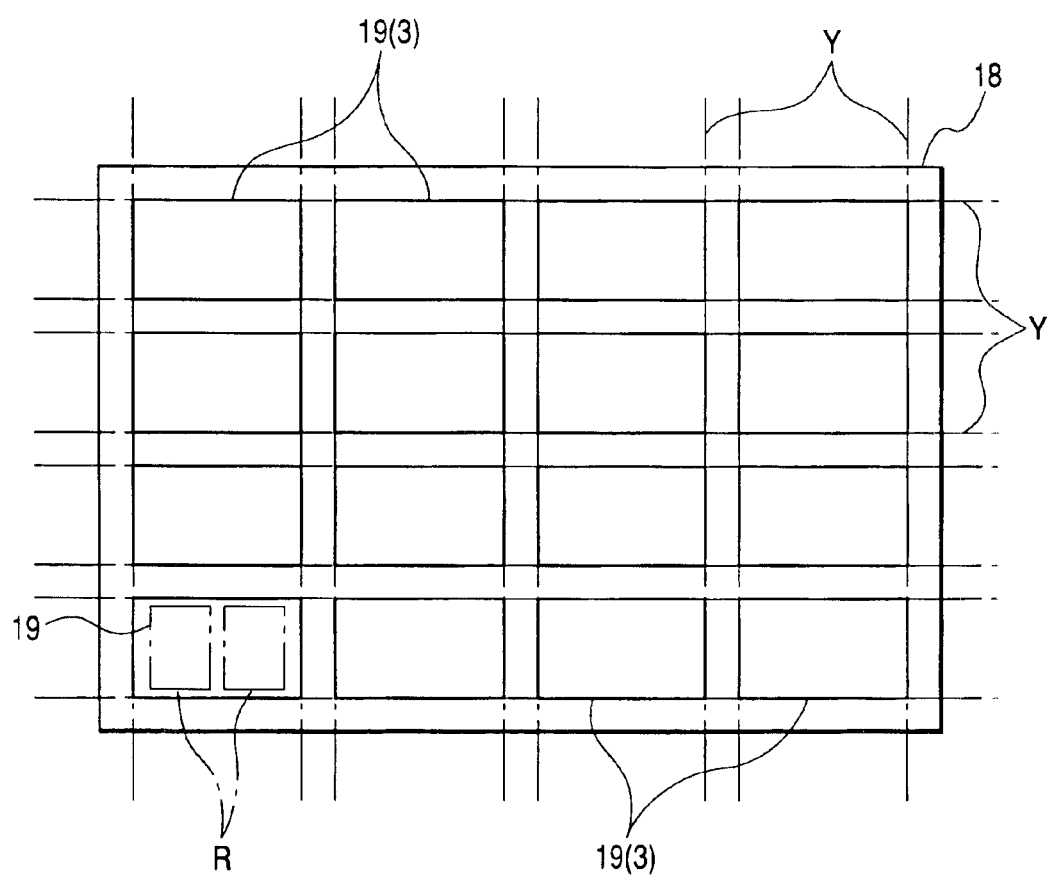
FIG. 13 is a plan view showing the positional relationship between a ceramic sheet and a chip region.

In the element formation process, the following layers; that is, the lower common electrode 37, the lower piezoelectric substances 35, the drive electrodes 33, the upper layer piezoelectric substances 34, and the upper common electrode 36, are formed within a formation range R shown in FIG. 13. The formation range R is set inward of the chip regions 19 (rectangular areas indicated by bold lines).

When the elements have been fabricated up to the upper common electrode 36; that is, when the element formation process has been completed, processing proceeds to a cutting process. In the cutting process, the ceramics sheet 18 is cut along cutting lines Y (see FIG. 13) running along the edges of the chip regions 19, thereby producing actuator units 3. In this case, as mentioned above, the formation region R, in which the electrode layers 33, 36, 37, the upper and lower piezoelectric substances, 34, 35, and the conduction electrode 39 and the feed terminal 40 are formed, is set inward of the chip region 19. Therefore, electrode material does not adhere to the cutting blade, and hence the cutting blade can be maintained sharp over a long time period. Moreover, the respective actuator units 3 can be cut with superior dimensional accuracy.

After the ceramic sheet 18 has been cut into the actuator units 3, processing proceeds to an inspection process, where there is performed an inspection as to whether or not the respective layers constituting the piezoelectric element 17 are formed properly. In the embodiment, the electrostatic capacitance relevant to the dimension (e.g., the thickness or width) of the piezoelectric layer can be measured for each of the piezoelectric substances 34, 35.

After all the piezoelectric elements 17 have finished undergoing inspection, a determination is made as to whether or not the thus-inspected actuator unit 3 is non-defective. The actuator units 3 that have been determined to be non-defective are classified according to the measured electrostatic capacitance. For instance, the actuator units 3 are ranked according to a mean electrostatic capacitance or on the basis of the range of variations in electrostatic capacitance.

Figure 10:
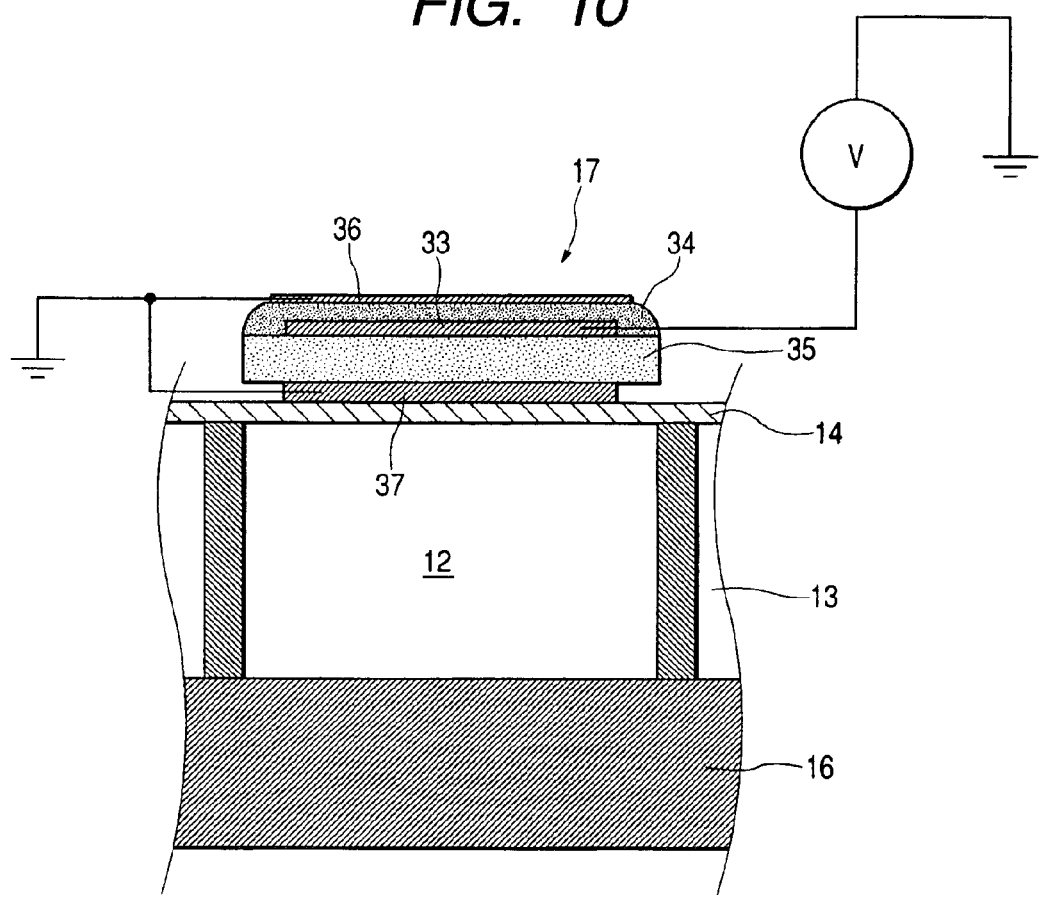
FIG. 10 is a view showing polarization of the piezoelectric element.

After having been classified, the actuator units 3 are subjected to a polarization process, where the produced piezoelectric elements 17 are polarized. As shown in, e.g., FIG. 10, in the polarization process the upper common electrode 36 and the lower common electrode 37 are connected to the ground, whereby the drive electrodes 33 are connected to the power source. In this case, polarization is effected at a voltage which is sufficiently higher than a drive voltage to be used. In the embodiment, the drive voltage is about 30 V, and hence the polarization voltage is set to 70 V or thereabouts. When the polarization voltage has been applied to the actuator units over a predetermined time period, the polarization process is completed.

After completion of the polarization process, processing proceeds to a conduction process. As shown in FIG. 9F, in the conduction process, the actuator units 3 that have been subjected to polarization processing are subjected to conduction processing, such as soldering, thereby bringing the upper common electrode 36 into conduction with the lower common electrode 37. For instance, the conduction member 47, such as solder or wire bonding, are provided so as to spread across the conduction area 42a and the conduction strip section 46.

By the foregoing configuration, polarizing operation is performed in the polarization process by applying a polarizing voltage to the piezoelectric element 17 by way of the drive electrodes 33. As a result, the upper layer piezoelectric substances 34 and the lower layer piezoelectric substances 35 can be polarized by a single operation. Therefore, superior workability can be achieved. The upper common electrode 36 and the lower common electrode 37 are electrically insulated from each other at the time of formation of electrodes. After processing pertaining to the inspection process has been completed, the electrodes are electrically connected together. Hence, through the inspection process one piezoelectric element 17 can be inspected while being separated into an upper layer piezoelectric substance and a lower layer piezoelectric substance. As a result, manufacture-related defects can be found with high accuracy.

As mentioned above, the formation range R, in which the electrode layers 33, 36, 37 and the upper and lower layer piezoelectric substances 34, 35 are to be formed, is set inward of the chip region 19. Therefore, electrode materials do not adhere to the cutting blade, and hence the cutting blade can be maintained sharp over a long time period. Moreover, the respective actuator units 3 can be cut with superior dimensional accuracy.

Thus far, there has been described a case where the upper common electrode 36 and the lower common electrode 37 are formed in a pectinated pattern. At least either the upper common electrode 36 or the lower common electrode 37 may be formed for each piezoelectric element 17, and the upper common electrode 36 and the lower common electrode 37 may be electrically connected together by a wiring member such as a flexible flat cable.

Figure 11A:
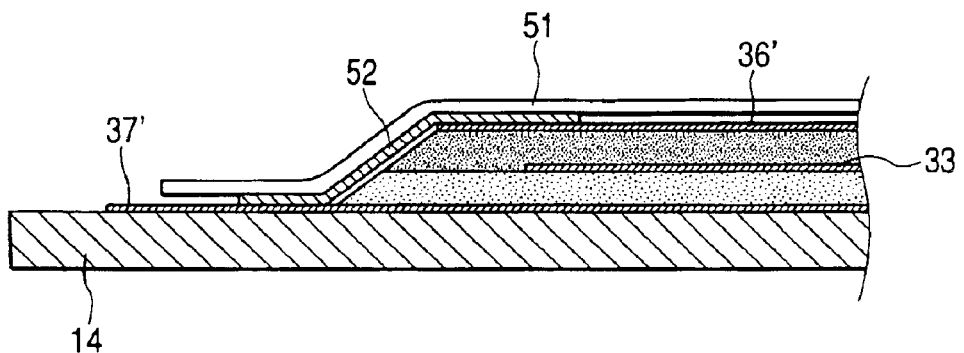
FIGS. 11A to 11C are views showing an example in which an upper common electrode is formed for each piezoelectric element and the upper common electrodes and the lower common electrode are electrically connected together by a wiring member.
Figure 11B:
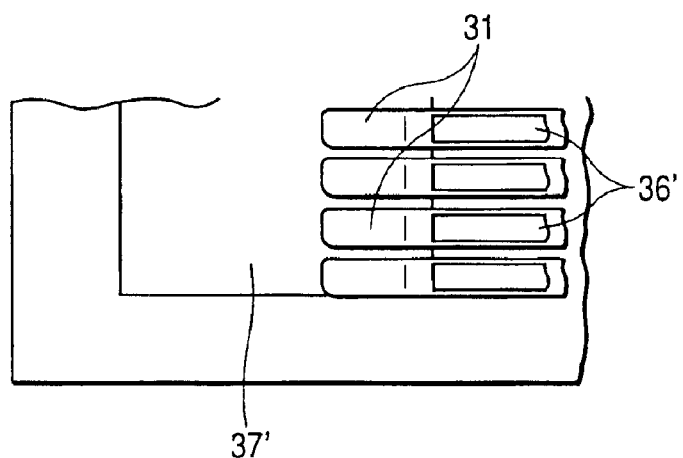
Figure 11C:
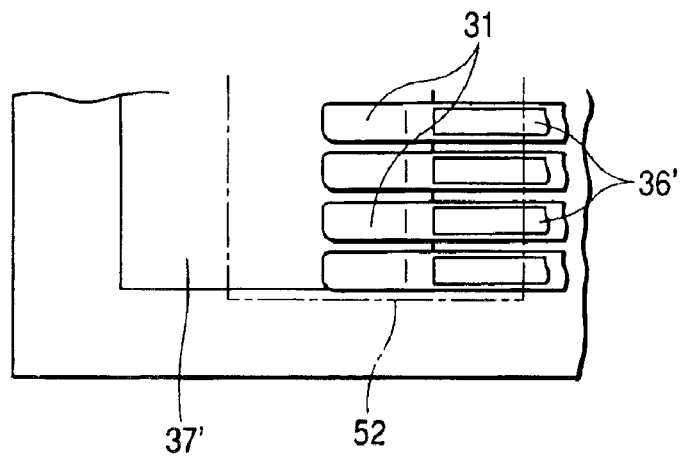

The examples shown in FIGS. 11A to 11C show that an upper common electrode 36' is individually formed for each piezoelectric element 17 and that a lower common electrode 37' is formed into a pectinated pattern. The examples are characterized by use of a wiring member 51 for bringing the upper common electrode 36' and the lower common electrode 37' into conduction. Specifically, the essential requirement is to form a conductive layer 52 at a connecting portion of the wiring member 51 in the form of a surface and to bond the conductive layer 52 while the conductive layer spans between the lower common electrode 37' (trunk electrode) and the upper common electrode 36'.

By such a configuration, one piezoelectric element 17 can be inspected through the inspection process while being separated into an upper layer piezoelectric substance and a lower layer piezoelectric substance. As a result, manufacture-related defects can be found with high accuracy.

In the embodiment, the upper common electrode 36 and the lower common electrode 37 are connected together and set to a ground potential. The intensity of the electric field imparted to the upper layer piezoelectric substance 34 is controlled by the thickness thereof, and the intensity of the electric field imparted to the lower layer piezoelectric substance 35 is controlled by the thickness thereof. The thickness tp1 of the upper layer piezoelectric substance 34 is made smaller than the thickness tp2 of the lower layer piezoelectric substance 35, whereby the electric field imparted to the upper layer piezoelectric substance 34 is made more intense than that imparted to the lower layer piezoelectric substance 35.

However, the invention is not limited to such a configuration. For instance, the upper common electrode 36 is electrically insulated from the lower common electrode 37. The upper common electrode 36 may be set to a common potential (e.g., an earth potential), whereas the lower common electrode 37 may be set to a bias potential which is higher than the common potential by a predetermined potential. By such a configuration, the electric field imparted to the lower piezoelectric substance 35 becomes weaker than the electric field imparted to the upper layer piezoelectric substance 34 by only an amount corresponding to a difference between the bias potential and the common potential. Put another way, the electric field imparted to the upper layer piezoelectric substance 34 becomes stronger than the electric field imparted to the lower layer piezoelectric substance 35 by the potential difference. A second embodiment in which the piezoelectric element is configured in the previously-mentioned manner will now be described.

Figure 12A:
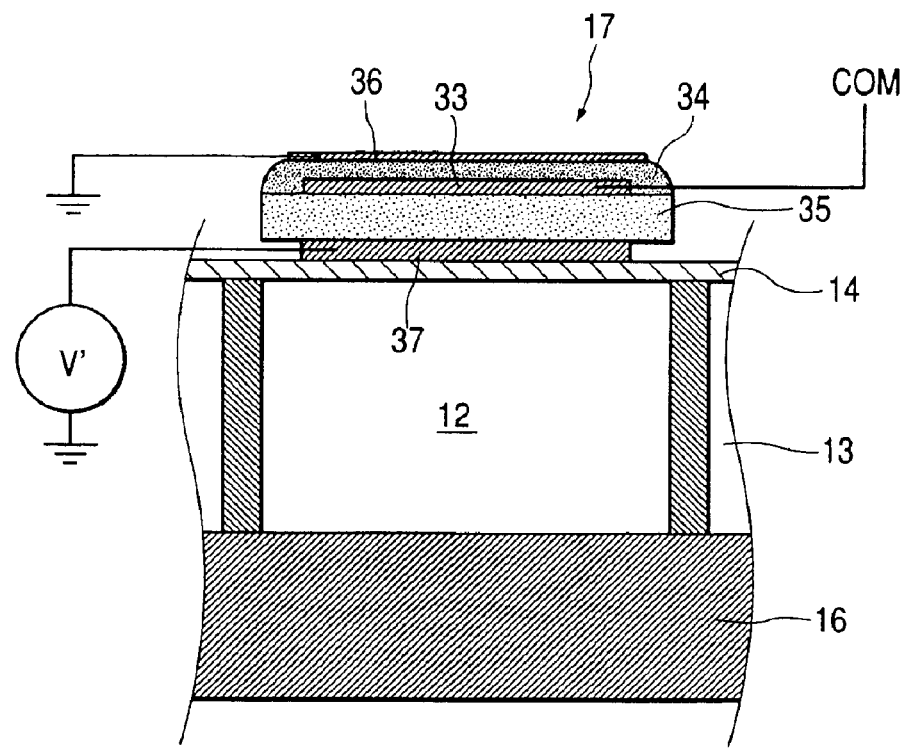
FIGS. 12A and 12B are views showing a piezoelectric actuator according to a second embodiment of the invention.
Figure 12B:
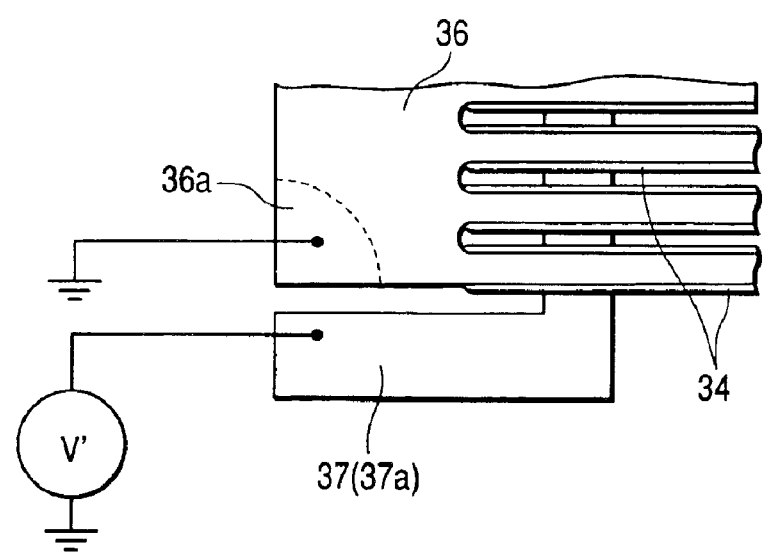

As shown in FIGS. 12A and 12B, in the embodiment, the conduction member 47 (see FIG. 9F) described in connection with the first embodiment is not provided, and the upper common electrode 36 and the lower common electrode 37 are electrically insulated from each other. The upper common electrode 36 is provided with a common potential supplying section 36a to be used for supplying a common potential to the upper common electrode 36, and the lower common electrode 37 is provided with a bias potential supplying section 37a to be used for supplying a bias potential V'. The common potential supplying section 36a and the bias potential supplying section 37a can be provided at arbitrary positions within the upper common electrode 36 and the lower common electrode 37. In the embodiment, as shown in FIG. 12B, the common potential supplying section 36a is provided adjacent to a portion of the upper common electrode 36 corresponding to the conduction area 42a of the embodiment, and the bias potential supplying section 37a is provided adjacent to a portion of the lower common electrode 37 corresponding to the conduction strip section 46.

This is intended for facilitating a wiring operation. The common potential and the bias potential V' are supplied to the upper common electrode 36 and the lower common electrode 37 by way of a wiring member 51 (see FIG. 11). Therefore, the wiring member 51 is provided with a wiring for supplying a common potential (e.g., an earth potential) and a wiring for supplying a bias potential V'. Extremities of the wiring patterns are exposed and coated with solder.

If, as in this embodiment, the common potential supplying section 36a and the bias potential supplying section 37a are arranged adjacent to each other, the common potential supplying section 36a, the bias potential supplying section 37a, and the wiring member 51 can be connected together by a single operation when the wiring member 51 is soldered to the head main body 1. To this end, the operation can be simplified, thereby enabling an improvement in workability. Further, such a configuration is also suitable for automating wiring operation.

In the embodiment employing that configuration, when the recording head is in use, the upper common electrode 36 is controlled to a common potential, and the lower common electrode 37 is controlled to a bias potential V'. Since the bias potential V' is set to a potential higher than the common potential, the potential difference between the drive electrode 33 and the upper common electrode 36 becomes greater than that existing between the drive electrode 33 and the lower common electrode 37 even when the drive signal to be used for the piezoelectric element 17 is a single signal. Consequently, the amount of deformation of the upper common electrode 36 becomes greater than that of the lower common electrode 37, thereby improving the deformation efficiency of the piezoelectric element 17. Further, imparting undue mechanical stress to the piezoelectric substance layers 34, 35 and the electrode layers 36, 37 becomes difficult, thereby improving durability.

In this case, a balance between the amount of deformation of the upper common electrode 36 and the amount of deformation of the lower common electrode 37 is defined by the magnitude of the bias potential V'. In the embodiment, the bias potential V' is defined within a range of about 5 to 20% of the drive voltage for the drive signal (i.e., a potential difference between the maximum potential and the minimum potential). Such a configuration obviates occurrence of a failure in an operation for ejecting ink droplets, thereby achieving a suitable balance between the amount of deformation of the upper layer piezoelectric substance 34 and the amount of deformation of the lower layer piezoelectric substance 35.

In the embodiment, the drive voltage is in the neighborhood of about 30 V, and hence the bias voltage V' is defined within the range of 1.5 V (5%) to 6 V (20%). Here, the predetermined voltage (e.g., 5V) is set within the range with regard to the bias potential V', and the drive voltage may be applied across the recording head, or a voltage value computed by multiplying the drive voltage with a coefficient may also be employed as the bias voltage V'.

The head main body 1 has two rows of nozzles 11. Each of the rows of nozzles can eject ink of different type. Generally, an ink jet recording head ejects four to seven colors of ink. Therefore, as shown in FIG. 15, the recording head has a plurality of head bodies 1. In order to record an image having superior color balance, the head main bodies 1 preferably have uniform ejection characteristics.

For example, as shown in FIG. 13, a plurality of actuator units 3, each constituting the primary section of the head main body 1, are fabricated from one ceramic sheet 18. More specifically, constituent elements of the actuator unit 3 (e.g., the pressure chamber 12 and the piezoelectric element 17) are formed in the respective chip regions 19 set in a matrix pattern. Subsequently, the ceramic sheet 18 is cut along the chip regions 19, thereby producing the actuator units 3. Therefore, the characteristic of the actuator unit 3 may change according to its position on the ceramic sheet 18. The reason for this is that the ceramic sheet 18 is subjected to non-uniform contraction at the time of sintering of the sheet-shaped precursor and that the degree of contraction of the ceramic sheet 18 changes according to a position on the sheet. For instance, in the case of a square sheet, the sheet tends to start undergoing sintering from a corner, and sintering also tends to proceed from the corner to the center.

In view of the circumstance, in the embodiment a plurality of head main bodies 1 to be attached to a single recording head are fabricated from head chips located in the chip region 19 on the single ceramic sheet 18 where a uniform contraction rate is achieved.

Figure 14:
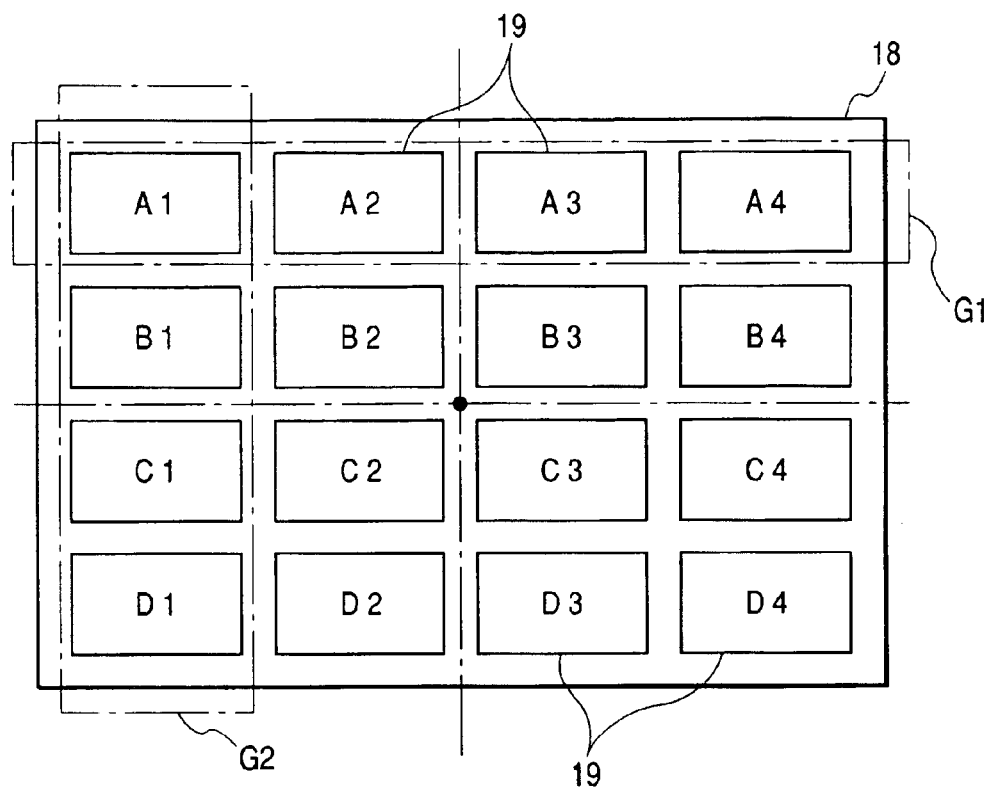
FIG. 14 is a plan view showing selection of an actuator unit.

For example, as shown in FIG. 14, there will now be described a case where 4-by-4 chip regions 19 (a total of 16 areas) are set on one ceramic sheet 18.

For the sake of convenience, the example shows rows A to D and first to fourth columns. The area defined by the row A and the first column is called a chip region A1, and the area defined by the row D and the fourth column is called a chip region D4.

When the chip regions 19 are arranged in a matrix manner, the contraction rate of the ceramic sheet 18 tends to become uniform in the direction of row or column. Therefore, in the case of the ceramic sheet 18 whose contraction rate is uniform in the direction of row, four head main bodies 1 fabricated from actuator units (head chips) 3 located in the same row: for example, the chip regions A1 to A4 indicated by a frame G1 in the drawing, are mounted on the single recording head. More specifically, the head main bodies 1 are mounted on a mount base 61 in an assembly process. Similarly, four head main bodies 1, selected from the head main bodies 1 located in the chip regions B1 to B4, the chip regions C1 to C4, or the chip regions D1 to D4, are mounted on the single recording head. In the case of the ceramic sheet 18 whose contraction rate is uniform in the direction of the column, as indicated by a frame G2 in the drawing, four head main bodies 1 are fabricated from head main bodies 1 located in the same column (i.e., chip regions A1, B1, C1, D1; chip regions A2, B2, C2, D2; chip regions A3, B3, C3, D3; and chip regions A4, B4, C4, D4). The head main bodies 1 fabricated from the head chips located in the chip regions 19 on the single ceramic sheet 18 where a uniform contraction rate is achieved are selected and mounted on the recording head. As a result, ink droplets ejected from the head main bodies 1 achieve a uniform ejection characteristic, thereby enabling recording of a high-quality image.

In this case, identification information indicating the locations of the chip regions on the ceramics sheet 18 is preferably provided. A combination of the head main bodies 1 can be readily grasped by ascertaining the identification information. For instance, when the electrode layers are coated with electrode material, the identification information is preferably printed through use of the electrode material. More specifically, an identification information patter is formed on a mask for electrode layer, and the identification information is also printed by coating the electrode layers.

In the embodiment, the width wp1 of the upper layer piezoelectric substance 34 and the width wp2 of the lower layer piezoelectric substance 35 are substantially equal to each other. However, the invention is not limited to such a configuration.

Figure 16:
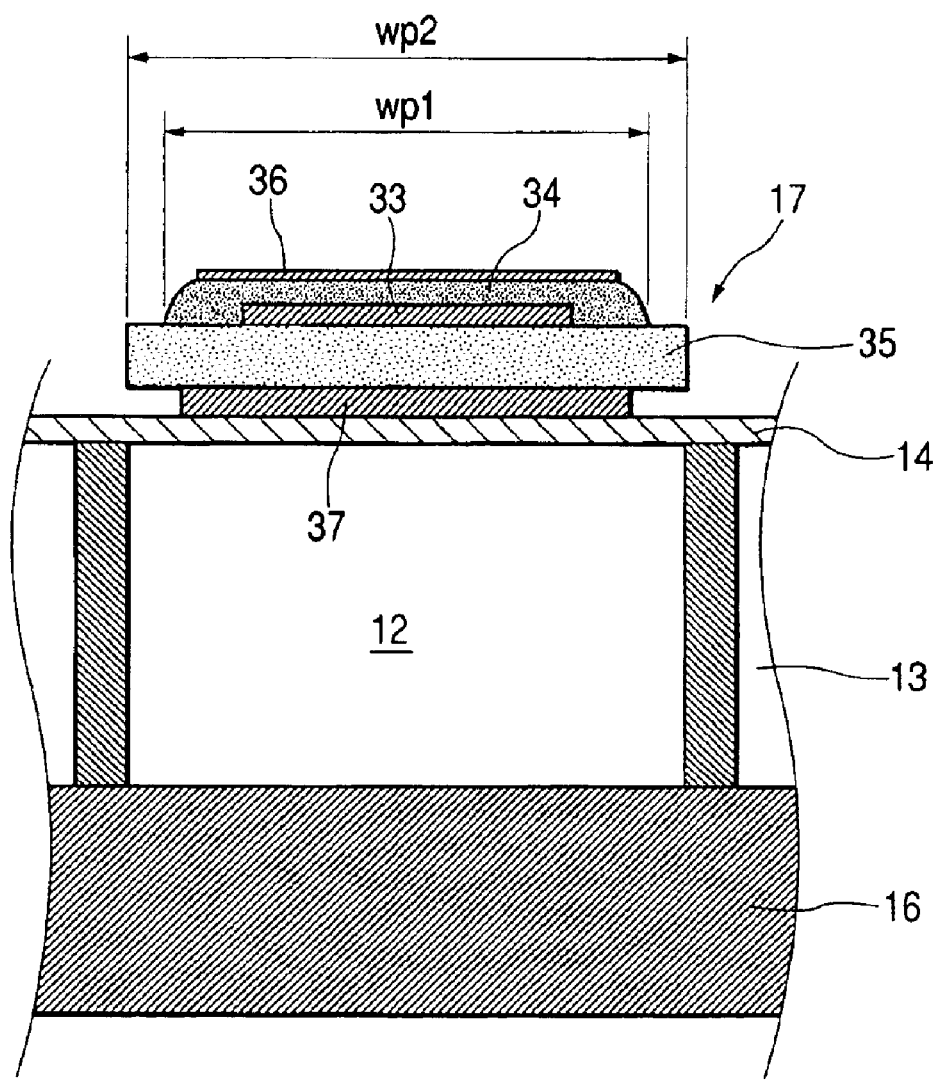
FIG. 16 is a view showing a piezoelectric actuator according to a third embodiment of the invention.

A third embodiment shown in FIG. 16 is characterized in that the width wp1 of the upper layer piezoelectric substance 34 is narrower than width wp2 of the lower layer piezoelectric substance 35. In other respects, the third embodiment is identical in configuration with the previous embodiment (see FIG. 4), and hence its repeated explanation is omitted. By the configuration, a substantial center of the upper layer piezoelectric substance 34 in the transverse direction thereof is actively deformed. Therefore, a center of the vibration plate 14 in its transverse direction is deformed greater than the side edges of the same. Consequently, the pressure chamber 12 can be subjected to efficient contraction.

Figure 17:
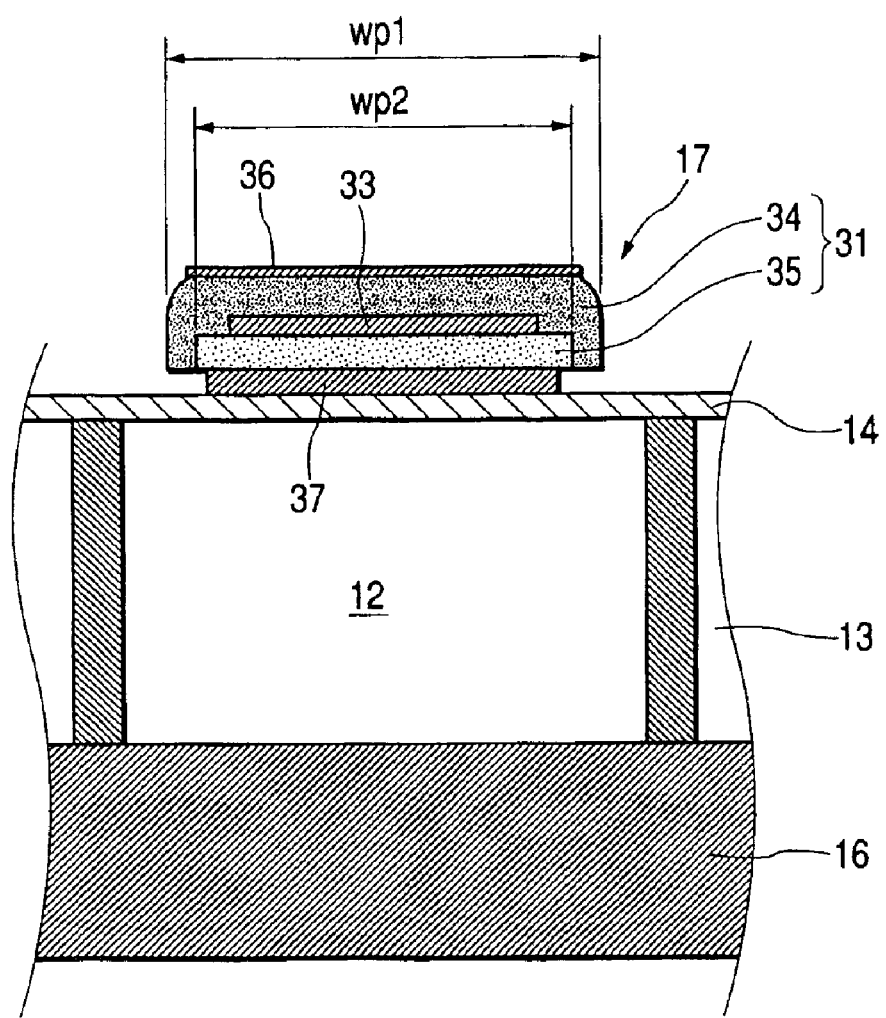
FIG. 17 is a view showing a piezoelectric actuator according to a fourth embodiment of the invention.

A fourth embodiment shown in FIG. 17 is characterized in that the width wp1 of the upper layer piezoelectric substance 34 is wider than the width wp2 of the lower layer piezoelectric substance 35. In other respects, the fourth embodiment is identical in configuration with the previous embodiment (see FIG. 4), and hence its repeated explanation is omitted. This configuration enables embedding of the drive electrode 33 in the piezoelectric substance layer 31 without fail. Accordingly, occurrence of a short between the drive electrode 33 and the upper common electrode 36 can be prevented without fail.

The foregoing descriptions have described a case where the invention is applied to a recording head which is a kind of liquid ejecting head and to a piezoelectric element and a piezoelectric actuator, which are employed in the recording head. The invention can also be applied to; for example, another liquid ejecting head, such as a liquid-crystal ejecting head and a coloring material ejecting head, and a piezoelectric element and a piezoelectric actuator for use with the liquid ejecting head. Moreover, the invention can also be applied to a piezoelectric element and a piezoelectric actuator for use in a micropump.

What is claimed is:

1. A piezoelectric element, comprising:
   a first common electrode, to be fixed at a predetermined potential;
   a first piezoelectric layer, laminated on the first common electrode and having a first deformability with respect to a predetermined voltage;
   a drive electrode, laminated on the first piezoelectric layer, to which a drive signal is supplied externally;
   a second piezoelectric layer, laminated on the drive electrode and having second deformability with respect to the predetermined voltage which is larger than the first deformability; and
   a second common electrode, laminated on the second piezoelectric layer and to be fixed at the predetermined potential;
   wherein the first piezoelectric layer is formed from a material having a first heat contraction rate, and the second piezoelectric layer is formed from a material having a second heat contraction rate which is smaller than the first heat contraction rate.

2. The piezoelectric element as set forth in claim 1, wherein the first piezoelectric layer has a first piezoelectric constant, and the second piezoelectric constant which is greater that the first piezoelectric.

3. A piezoelectric actuator, comprising a vibration plate on which the piezoelectric element as set forth in claim 1 is disposed.

4. A liquid ejecting head, comprising the piezoelectric actuator as set forth in claim 3 such that the piezoelectric element opposes to a chamber communicated with a nozzle orifice from which a liquid droplet is ejected.

5. The piezoelectric element as set forth in claim 1, wherein the first piezoelectric layer is polarized in a first direction and the second piezoelectric layer is polarized in a second direction which is different from the first direction.

* * * * *